(12) United States Patent
Gherman et al.

(10) Patent No.: US 6,259,227 B1
(45) Date of Patent: Jul. 10, 2001

(54) ARRANGEMENT AND METHOD FOR CONTROLLING THE POWER SUPPLY TO A LOAD

(75) Inventors: Gheorghe Gherman, Täby; Peter Blomberg, Stockholm, both of (SE)

(73) Assignee: Aktiebolaget Electrolux, Stockholm (SE)

(*) Notice: Subject to any disclaimer, the term of this patent is extended or adjusted under 35 U.S.C. 154(b) by 0 days.

(21) Appl. No.: 09/299,446

(22) Filed: Apr. 26, 1999

(30) Foreign Application Priority Data

Apr. 28, 1998 (SE) .................................... 9801484

(51) Int. Cl.[7] .................................................... H02J 7/00
(52) U.S. Cl. ............................................ 320/101; 320/104
(58) Field of Search .................................... 320/101, 103, 320/104, 128, 131; 136/243

(56) References Cited

U.S. PATENT DOCUMENTS 6,054,838 * 4/2000 Tsatsis ................................. 320/101
6,059,064 * 5/2000 Nagano et al. ...................... 180/234

* cited by examiner

Primary Examiner—Peter S. Wong
Assistant Examiner—Lawrence Luk
(74) Attorney, Agent, or Firm—Pearne & Gordon LLP

(57) ABSTRACT

Arrangement for controlling the power supply to a load (19) fed from a rechargeable current source (15) of limited capacity, such as a battery, supplied with energy from a generator (17), a solar cell arrangement or the like and connected to the load (19) via a line (12) of undetermined resistance which connects to the load (19) via a terminal (16) at which voltage measurements can be performed. The arrangement is an electronic control arrangement (18) disposed adjacent to the load (19) and connected to the terminal (16). The electronic arrangement performs voltage measurements at said terminal in accordance with a predetermined program. In a series of such voltage measurements a first one is performed with the load (19) disconnected, whereas one or a plurality of measurements are performed with the load (19) connected. The first voltage measurement value represents the terminal voltage of the current source (15) at the start of the series of measurements. Said terminal voltage is then calculated from the latest measured voltage value at the terminal (16) prior to the connection of the load (19) and the first measured voltage value at the terminal (16) after the connection of the load (19). The latest measured voltage value at the terminal (16) prior to the connection of the load (19) is in turn updated for each new measured voltage value at the terminal (16).

12 Claims, 3 Drawing Sheets

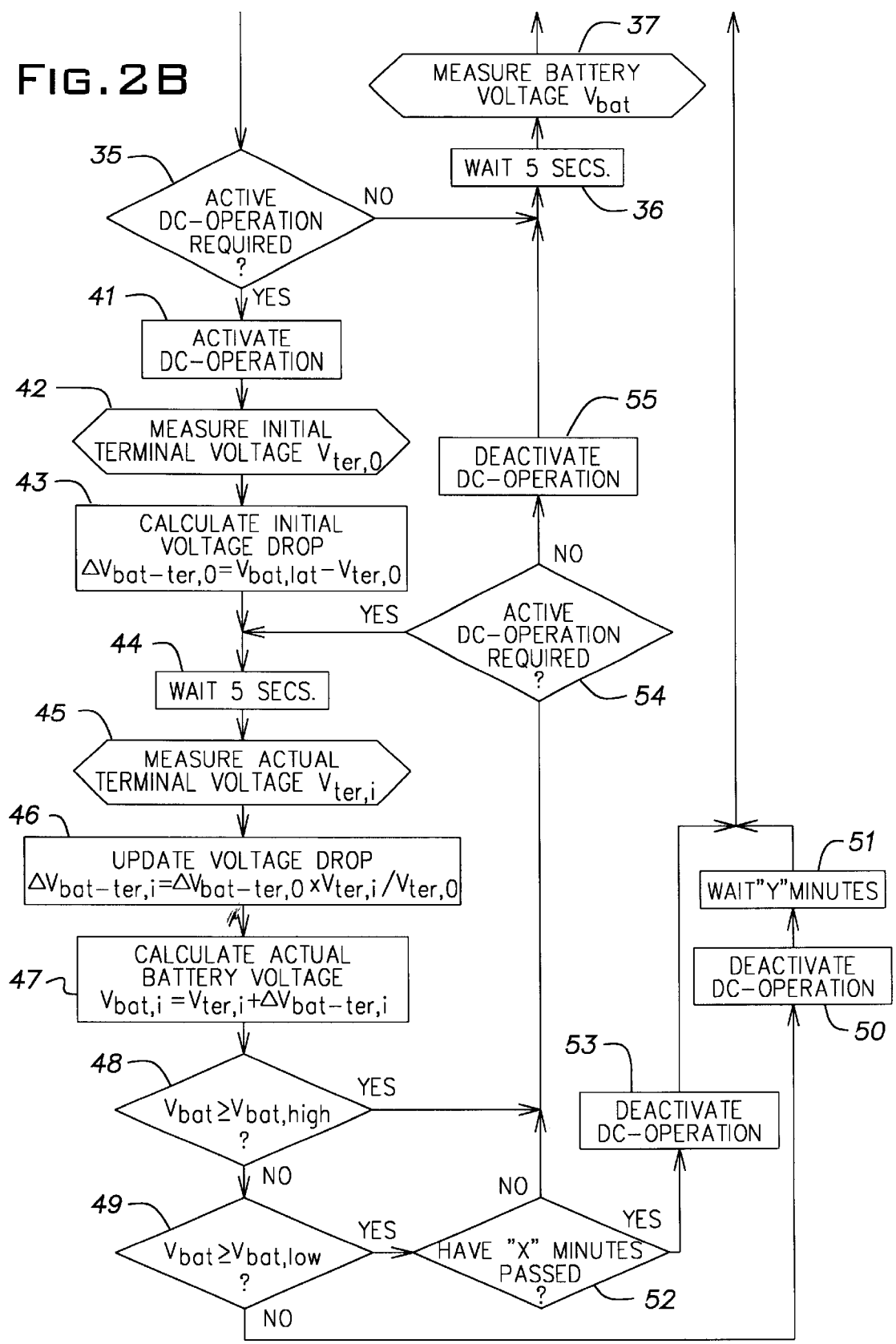

ARRANGEMENT AND METHOD FOR CONTROLLING THE POWER SUPPLY TO A LOAD

BACKGROUND OF THE INVENTION

The present invention refers to an arrangement and a method, respectively, for controlling the power supply to a load fed from a rechargeable current source of limited capacity, such as a battery, to which energy is supplied by a generator, a solar cell arrangement or the like, said battery being connected to the load via a line of undetermined resistance and a terminal at which voltage measurements can be carried out. Due to the limited capacity of the current source it is often a necessity that the connecting time of the current source be limited to avoid such extensive discharge that would cause damage to the current source. For example, a rechargeable battery must not be discharged below a certain voltage level for a subsequent recharge to be able to restore the battery to its full capacity.

In an arrangement of the kind indicated the voltage at the terminal is made an indication of the terminal voltage of the battery. Accordingly, when the voltage at the terminal goes below a predetermined first limit the battery is disconnected, the battery being reconnected after having being recharged to a level such that the voltage at the terminal exceeds a predetermined second limit, slightly higher than the first limit. The difference between the two limits is conditioned by the fact that the voltage measurement takes place at a point remote from the current source so that the voltage measured is lower than the actual voltage across the poles of the current source, in turn caused by the voltage drop appearing across the line when current is supplied to the loads. Hence, the second limit must exceed the first limit by a value at least corresponding to said voltage drop in order that a reconnection of the current source will not be followed by an immediate disconnection of said source.

As from one application to another it may be difficult to determine the magnitude of the line resistance and, in addition, the voltage drop across the line varies with the magnitude of the current supplied it is rather difficult to find proper limits which, as close as possible, correspond to those chosen if the line resistance were nil.

An area of useful application of the invention includes caravans and motor caravans wherein a refrigerator disposed in the caravan or in the motor caravan is fed from the starter battery of the traction vehicle or the motor caravan, respectively. The starter battery is a traditional lead accumulator charged from a generator when the engine of the traction vehicle or the motor caravan is running. The supply of the refrigerator is maintained as long as the engine is operating and the battery is charged and continues also for a predetermined time after the engine has been stopped. This predetermined time is related to the fact that the terminal voltage of the battery must not fall to such a low level that the remaining battery capacity is insufficient for restart of the engine. A system of the kind referred to is disclosed in EP-0389059. In this publication a more detailed discussion is given of the problems associated with the measuring of the terminal voltage of the battery when the engine is inoperative, the generator is standing still and the battery supplies power to the load (refrigerator). Moreover, the problem is addressed of estimating the voltage drop across the line between the battery and the load, said problem being caused by the variation of the electric wiring from one caravan model to another and also between different combinations of traction vehicle/caravan. In the publication a solution is proposed according to which a voltage measurement for determining of the terminal voltage of the battery takes place with the load disconnected followed by current supply to the load for a relatively long time period. However, this method of determining the terminal voltage involves functional disadvantages where the load is a refrigerator.

BRIEF SUMMARY OF THE INVENTION

It is an object of the invention to provide an arrangement of the kind indicated by way of introduction wherein a voltage measurement takes place with the load connected and the voltage measurements performed remotely from the current source become a measure of the terminal voltage of the current source, said terminal voltage being continuously updated in order for the influence of the voltage drop to be essentially eliminated. Another object is to suggest a method, the use of which mainly eliminates the influence of the voltage drop across the line. The objects indicated will be achieved in an arrangement having the features included in the appending claims 1–6 and by the use of a method according to claims 7–12, respectively.

DESCRIPTION OF THE DRAWINGS

An arrangement according to the invention can be used in various situations where a load supplied from a battery is disposed remotely from the current source and the intermediate line network has a resistance which is not unambiguously determined and which, in addition, varies due to corrosion in connectors, terminal blocks and the like. For a more detailed description of the invention, among various applications one application has been chosen where the load is a refrigerator installed in a caravan. The refrigerator is of the absorption typed which can be drive by different kinds of energy. A prior art system for the control of the mode of operation of the refrigerator makes possible the connection of mains voltages, e.g. 230 volts AC, a battery, e.g. for 12 volts, or gas operation. For the control an electronic control arrangement is used to which sensors have been connected which sense the available voltage and control the selection of mode of operation so that mains voltage is used if available, battery as a second choice and gas operation as a third choice. Systems of the kind referred to are disclosed in the publications US-A-4,656,837 and FR-B-2552281.

The invention will now be described more in detail in connection with an embodiment with reference to the appending drawings, in which:

FIG. 2B shows a second part of the flow diagram.

DESCRIPTION OF THE INVENTION

Figure 1:
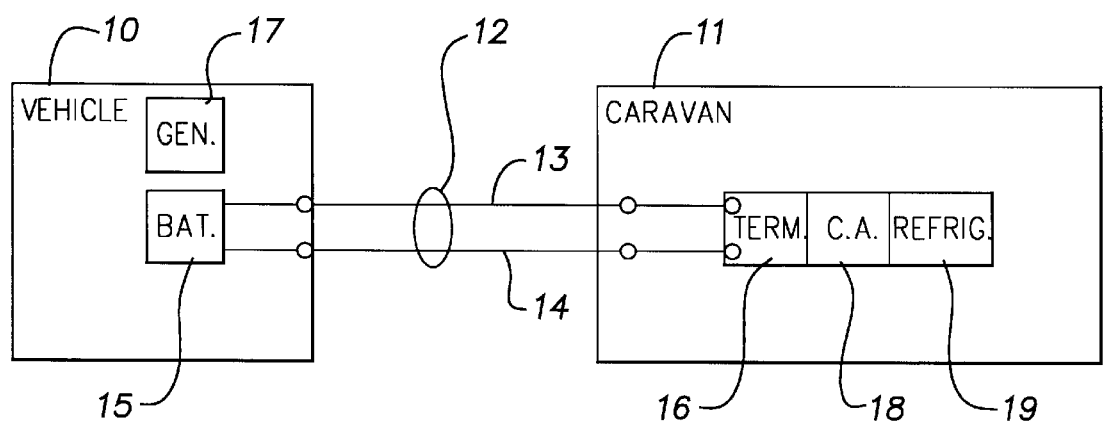
FIG. 1 schematically shows the control arrangement according to the invention implemented in connection with a refrigerator disposed in a caravan connected to a vehicle.

With reference to FIG. 1 there is shown schematically a traction vehicle 10 which, by means of common connector means, both mechanical and electrical, is connected to a caravan 11. The electrical connector means comprises a line 12 including two conductors 13, 14 connecting an accumulator battery 15, disposed in the traction vehicle, with a terminal block 16 provided in the caravan 11. In the usual way the battery 15 is connected to a generator 17 which, in a way known in the art, charges the battery via regulating means, not shown, when the engine of the traction vehicle is running. An electronic control arrangement 18, e.g. a microcomputer comprising a processor and requisite storage means etc., is provided in the caravan adjacent to the terminal block 16. A refrigerator 19 of the absorption type is provided in the caravan and connected to the control arrangement 18. The refrigerator 19 is controlled by a thermostat, not shown, such that the temperature of the refrigerator is kept essentially constant. Of Course, such temperature control can be accomplished by means of the microcomputer and a temperature sensor disposed in the refrigerator 19 and connected to the microcomputer. However, this control is outside of the invention and will not be discussed in greater detail.

The electronic control arrangement 18 is of the kind permitting the use of different kinds of energy for the operation of the refrigerator. The arrangement is adapted to set the refrigerator for operation with mains voltage, e.g. 230 volts, when available, for example at a power point of a caravan site. When mains voltage is not available DC supply from the battery of the traction vehicle takes place and if the battery voltage is insufficient the control arrangement automatically selects gas operation. The two modes of operation, mains voltage and gas operation, respectively, are outside of the invention and will be left at that so that the description to follow will be directed to DC-operation and the associated problems which are to be solved by the invention.

As indicated above DC-operation, usually at 12 volts, is allowed only when the battery is sufficiently charged which can be indicated, in a way known in the art, by the fact that the battery voltage exceeds a fixed limit, below referred to as $V_{bat,low}$. Of course, DC-operation is also allowed when the vehicle engine is running and the generator is charging the battery indicated by an increased voltage value $V_{bat,high}$, which is the terminal voltage of a sufficiently well charged battery when being charged by a generator. The two voltage values referred to are present in the description given below of the flow diagram shown in FIGS. 2A and 2B and illustrating the operation of the control arrangement 18. In a way known in the art the desired function is determined by a program stored in memory, not shown, in the control arrangement 18. The program, in the example given to a minor extent also including steps relating to the energy selecting system, is illustrated by the flow diagram shown in FIGS. 2A and 2B where the two diagram parts are put together by the lower part of FIG. 2A connecting to the upper part of FIG. 2B.

Prior to the detailed description of the program with reference to the flow diagram of FIGS. 2A and 2B a more general description will be given on the lines of thought behind, also in connection with a specific application including power supply of a caravan refrigerator from a battery in a traction vehicle.

The control arrangement 18 of FIG. 1 measures the DC voltage at the terminal 16 at regular intervals of about 5 seconds. In order to eliminate random voltage variations the control arrangement measures the DC voltage 100 times, suppresses preposterous values and performs an on-line filtering of the measured voltage values, wherein the length of the measurement period is 0.4 seconds.

As long as DC-operation has not been selected or DC-operation has not been activated (load disconnected) with very good approximation the voltage at the terminal is equal to the battery voltage $V_{bat}$. Upon a demand from the control arrangement for the selection of DC-operation mode the control arrangement checks whether DC-operation mode has been disconnected due to the voltage being to low. If this is not the case DC-operation mode is selected if the battery voltage $V_{bat}$ is higher or at least equal to the predetermined limit $V_{bat,high}$. The limit $V_{bat,high}$ is set so that DC-operation mode is selected only if the engine is running. If so, DC-operation mode is selected only if $V_{bat}$ is higher or at least equal to $V_{bat,high}$ to which a hysteresis value $\Delta V_{bat,hys}$ has been added for the purpose of allowing recharging of the battery.

In case DC-operation has been selected the control arrangement continues measuring the voltage at the terminal 16 at regular intervals of 5 seconds. If active DC-operation has not yet been requested by the thermostat of the refrigerator the terminal voltage, still equal to the battery voltage $V_{bat}$, is compared with the limit $V_{bat,high}$. If $V_{bat}$ is at least equal to $V_{bat,high}$ the DC-operation made remains selected. If $V_{bat}$ falls below $V_{bat,high}$ but not below a second limit $V_{bat,low}$ the DC-operation mode remains selected for a predetermined time, below denoted by x minutes. If $V_{bat}$ falls below $V_{bat,low}$, then the DC-operation mode is immediately disconnected. The limit $V_{bat,low}$ is selected such that the battery does not become discharged below the limit for the normal usage level.

When the DC-operation mode is selected DC-operation can be activated on demand from the thermostat in the refrigerator 19 and the DC-heater of the refrigerator is connected. After this connection the control arrangement measures the voltage $V_{ter}$ at the terminal 16 in the same way as the voltage $V_{bat}$. The initial voltage drop $\Delta V_{bat-ter,0}$ between the battery 15 and the terminal 16 is then calculated by use of the latest known battery voltage $V_{bat,lat}$ and the first terminal voltage $V_{ter,0}$ measured during a period of 0.4 seconds after the connection of the heater according to the following relation:

$$\Delta V_{bat-ter,0} = V_{bat,lat} - V_{ter,0}$$

The voltage at the terminal 16 is measured at regular intervals of 5 seconds. If the next measured voltage value is $V_{ter,1}$ the control arrangement updates the voltage drop $\Delta V_{bat-ter,0}$ to $\Delta V_{bat-ter,1}$ according to the following relation:

$$\Delta V_{bat-ter,1} = \Delta V_{bat-ter,0} \times (V_{ter,1}/V_{ter,0})$$

This updating formula is based on the realistic assumption that the resistance of the line conductors and of the heater is constant.

Then, the control arrangement 18 calculates the updated battery voltage according to the following relation:

$$V_{bat,1} = V_{ter,1} + V_{bat-ter,1}$$

If the voltage $V_{bat,1}$ is higher than the limit $V_{bat,high}$, then the DC-operation continues. If $V_{bat,1}$ is lower than $V_{bat,high}$ but higher than $V_{bat,low}$, then the DC-operation is discontinued and the DC-operation mode is disabled after a certain predetermined time. Finally, if $V_{bat,1}$ is lower than $V_{bat,low}$ then the DC-operation is immediately disconnected and the DC-operation mode disabled with a certain time delay.

The DC voltage at the terminal 16 is again measured after about 5 seconds if DC-operation is still prevailing and the measured voltage is $V_{ter,2}$ the corresponding calculated battery voltage will become:

$$V_{bat,2} = V_{ter,2} + \Delta V_{bat-ter,0} \times (V_{ter,2}/V_{ter,0})$$

Now, the control arrangement 18 compares the newly calculated battery voltage with the limits $V_{bat,high}$ and $V_{bat,low}$ and corresponding decisions are taken. The process continues as long as the DC-operation mode is selected.

The limits $V_{bat,high}$ and $V_{bat,low}$ are related to the battery voltage and not to the DC voltage at the terminal so as not to depend on the voltage drop between the battery and the refrigerator. This results in a more simple and safe selection of the limits from a DC-operation point of view. In order to ensure that DC-operation mode is selected and DC-operation goes on only in the case the vehicle engine is running the limit $V_{bat,high}$ is set to a value between the battery voltage when the engine is running (normally 13.8–14,6 volts) and the battery voltage when the engine is not running (normally 12.0–12.8 volts). The limit $V_{bat,low}$ can be selected so that the battery will not be discharged below 50% of the level of a fully charged battery.

Figure 2A:
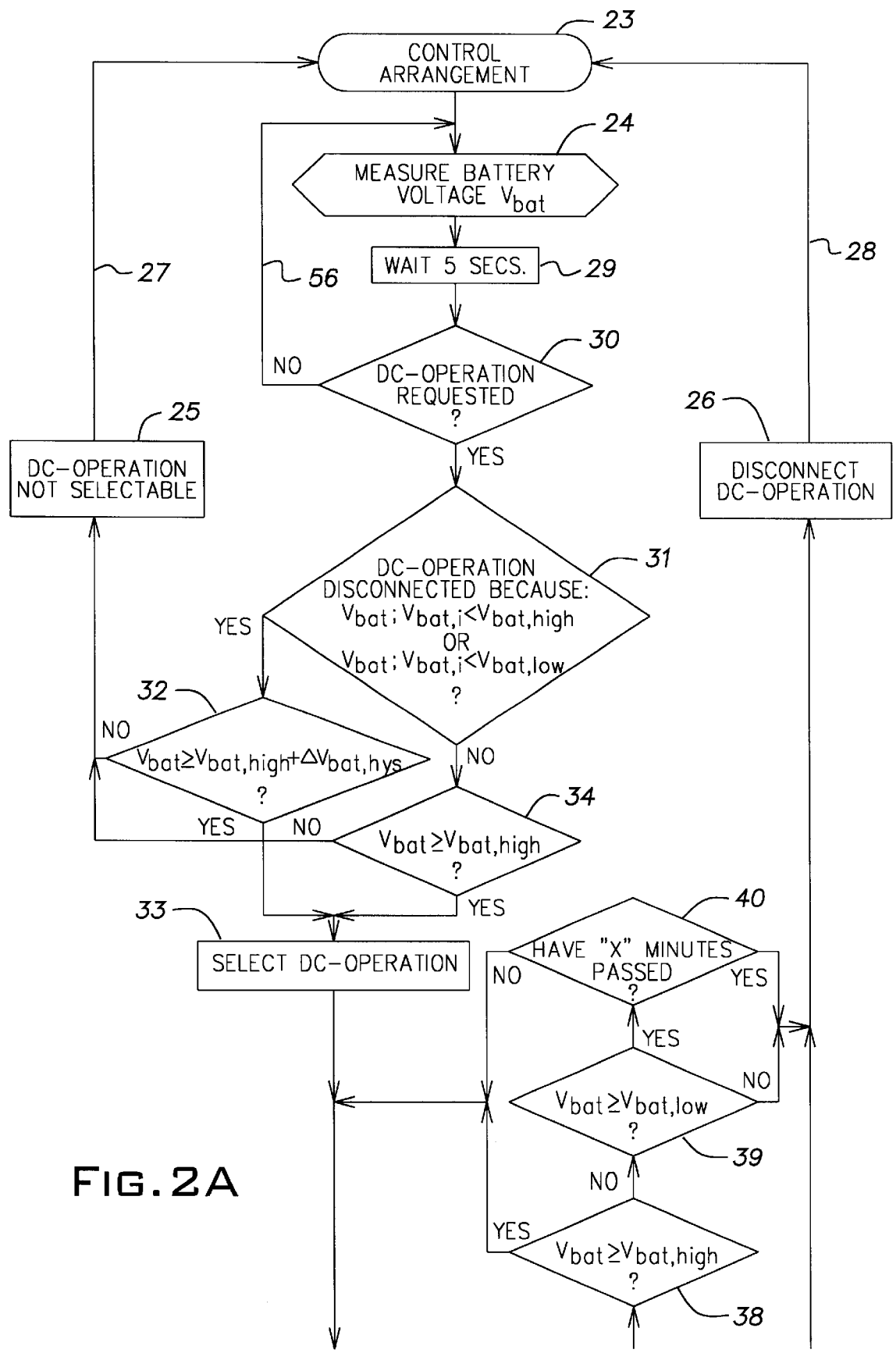
FIG. 2A shows a first part of a flow diagram illustrating the function of the control arrangement.

With reference to the flow diagram of FIGS. 2A and 2B the uppermost block 23 is designated "control arrangement" and represents the control arrangement 18 of FIG. 1. In the next block 24 order is given from said control arrangement to effect measurement of the voltage $V_{bat}$ of the vehicle battery 15. As appears in the drawing two blocks 25 and 26 are provided, designated "DC-operation can not be selected" and "disconnect DC-operation", and the respective block is connected to the block 23 via arrows 27, 28, respectively, with the meaning that the initial voltage measurement ordered by the control arrangement takes place under the presumption that DC-operation has not been selected. The voltage measurement actually takes place at the terminal 16 but under the conditions given the voltage at the terminal is the same as the battery voltage.

Voltage measurements take place with regular intervals of about 5 seconds represented by a waiting block 29.

The next block 30 contains the question "request for DC-operation?" and if the answer is "no" a loop, represented by an arrow 56, leads back to a point between the blocks 23 and 24. If the answer is "yes" then the program proceeds to a new question block 31 with the following questions: "has DC-operation been disconnected due to $V_{bat}$; $V_{bat,i} < V_{bat,high}$ or $V_{bat}$; $V_{bat,i} < V_{bat,low}$?". If the answer is "yes" the program proceeds to a new question block 32 with the question "$V_{bet} \geq V_{bet,high} + \Delta V_{bet,hys}$?". If the answer is "no" the program returns to block 25 in turn notifying the control arrangement in block 23 that DC-operation cannot be selected. If the answer is "yes" the program proceeds to a block 33 "select DC-operation". If the answer in block 31 is "no" the program proceeds to a question block 34 with the question "$V_{bat} \geq V_{bat,high}$?" If he answer is "no" the program proceeds to block 25 whereas if the answer if "yes" the program proceeds to the block 33.

In block 33 selection of DC-operation takes place and in the next block 35 the question is asked "is active DC-operation requested?", in the case described meaning that a thermostat provided in the refrigerator load 19 requests power supply for lowering of the temperature in the refrigerator. If the answer to the question is "no" the program makes a loop to a waiting block 36 wherein the program stops for 5 seconds. Then the program proceeds to a block 37 wherein measurement of the battery voltage takes place as in block 24. In the following question block 38 the question is asked; "$V_{bat} \geq V_{bat,high}$?" and if the answer is "yes" the program returns to a block 35. If the answer is "no" the program proceeds to a block 39 where the question is asked: "$V_{bat} \geq V_{bat,low}$?" If the answer is "yes" the program proceeds to a block 40 wherein the question is asked: "have x minutes passed?", where x indicates the time during which DC-operation can continue after the vehicle engine has been stopped and, accordingly, the generator is not operating. During this time, x minutes, DC-operation remains selected and gas operation cannot be selected which is required for safety reasons. If the answer is "yes" the program proceeds to a block 26 with the result that DC-operation is disconnected. If the answer is "no" the program proceeds to block 35 and, hence, DC-operation is still possible.

The continued description will discuss more in detail the part of the program in which the invention will be applied for the updating of the voltage measured at the terminal 16 for eliminating of the source of errors caused by the voltage drop between the battery 15 and the terminal 16.

In block 35 the question is asked; "is active DC-operation requested?" and if the answer is "yes" the program proceeds to a block 41 resulting in that DC-operation is activated and, accordingly, the DC-heater connected. The program proceeds to a block 42 wherein measurement is initiated of $V_{ter,0}$ at the terminal 16. This voltage $V_{ter,0}$ is lower than voltage of the battery due to the voltage drop between the battery 15 and the terminal 16. The program now proceeds to a block 43 in which a first voltage drop between the battery 15 and the terminal 16 is calculated as follows; $\Delta V_{bat-ter,0} = V_{bat,lat} - V_{ter,0}$, where $V_{bat,lat}$ is the latest measured voltage at the terminal prior to the activation of DC-operation. Then follows a waiting block 44 in which the program stops for 5 seconds and the execution then proceeds, in a block 45, with a measurement of the actual voltage $V_{ter,1}$ at the terminal.

At this point in the program the condition for the updating of the voltage drop between the battery 15 and the terminal 16 is given in a block 46 according to the following relation: $\Delta V_{bat-ter,i} = \Delta V_{bat-ter,0} \times (V_{ter,i}/V_{ter,0})$. This updated voltage drop $\Delta V_{bat-ter,i}$ can now be used for the updating of the actual battery voltage and this is performed in a block 47 according to the relation: $V_{bat,i} = V_{ter,i} + V_{bat-ter,i}$. The program now proceeds to a question block 48 where the question is asked: "$V_{bat,i} \geq V_{bat,high}$?". If the answer to the question is "no" then the program proceeds to a block 49 in which the question in asked: "$V_{bat,i} \leq V_{bat,high}$?". If the answer is "no" DC-operation is deactivated in a block 50 from which the program proceeds to a waiting block 51 in which the program stops for y minutes in order to prevent selection of gas operation. When a time period corresponding to y minutes has passed the program proceeds to block 26 in which the mode DC-operation is deactivated and activation of gas operation becomes possible.

If the answer to the question asked in block 48 is "yes" then the program proceeds to a block 54 wherein the question is asked: "is active DC-operation requested?". If the answer is "yes" the program proceeds to block 44 and then goes through the steps involved in connection with the DC-operation and the continuous updating of the calculated battery voltage. If the answer to the question in block 54 is "no" then the program proceeds to a block 5 where DC-operation is deactivated and the program proceeds to block 36 in which the program halts for 5 seconds.

If the answer to the question in block 49 is "yes" then the program proceeds to a block 52 in which the question is asked: "have x minutes passed?". If The answer is "no" the program proceeds to block 54. As long as x minutes have not passed, the mode DC-operation remains selected and gas operation can not be selected. During this time, x minutes, DC-operation can be activated if requested by the thermostat in the refrigerator. If the answer to the question "have x minutes passed?" is "yes" deactivation of DC-operation takes place in block 53 and then the program proceeds to block 26 in which the mode DC-operation is disabled and will not again become possible until a new program execution gives the green light that the battery has been recharged.

In the example described battery supply of a refrigerator disposed in a caravan or the like is effected from a battery disposed in a traction vehicle and charged by a generator in said vehicle, However, the invention is not restricted only to applications of the kind described but can be used in all cases where a load is to be supplied from a battery or the like with an intermediate line connection the resistance of which varies from one installation to another and hence becomes difficult to determine or may vary with respect to time. The suggested updating of the battery voltage based on the voltage measured at a terminal adjacent the load and remote from the battery offers an easy way of getting rid of the source of errors resulting from varying voltage drops in the line network.

What is claimed is:

1. An arrangement for controlling power supply to a load (19) fed from a rechargeable current source (15) of limited capacity, supplied with energy from a generator (17) and connected to the load (19) via a line (12) of resistance which connects to the load (19) via a terminal (16) at which voltage measurements can be performed to measure a voltage, characterized in that the control arrangement is an electronic control arrangement (18) disposed adjacent to the load (19) and connected to the terminal (16), said control arrangement being arranged to allow for a current supply from the rechargeable current source if the voltage has a value greater than or equal to an upper reference value Vbat,high, the current supply is continued from the rechargeable current source during a predetermined time if the voltage is below the reference value Vbat,high but exceeds a second reference value Vbat,low, and the current supply is disrupted if the voltage is below the reference value Vbat,low, said control arrangement being arranged to perform voltage measurements at said terminal in accordance with a program means for determining a terminal voltage, wherein in a series of said voltage measurements at least one measurement is performed with the load (19) disconnected, whereas at least one measurement is performed with the load (19) connected, the initial measured voltage value representing the initial terminal voltage of the current source (15) at the start of the series of measurements, said terminal voltage then being calculated from the latest measured voltage value at the terminal (16) prior to the connection of the load (19) and the first measured voltage value at the terminal (16) after the connection of the load (19), the latest measured voltage value at the terminal (16) prior to the connection of the load (19) in turn being updated for each new measured voltage value at the terminal (16).

2. An arrangement according to claim 1, characterized in that the difference between the latest measured voltage value at the terminal (16) prior to the connection of the load (19) and the first measured voltage value at the terminal (16) after connection of the load (19) is updated according to the following relation:

$\Delta V_{bat-ter,i} = \Delta V_{bat-ter,0} \times V_{ter,i}/V_{ter,0}$, where $V_{ter,0}$ is a first measured voltage value at the terminal (16) with connected load (19);

$\Delta V_{ter,i}$ is any measured voltage value at the terminal (16) with connected load (19);

$\Delta V_{bat-ter,0}$ is the difference between the latest measured voltage value $V_{bat,1st}$ at the terminal (16) with the load (19) disconnected and $V_{ter,0}$.

3. An arrangement according to claim 2, characterized in that the terminal voltage of the current source is calculated according to the relation:

$V_{bat,i} = V_{ter,i} + V_{bat-ter,i}$, where $V_{ter,i}$ represents any voltage value measured at the terminal (16) with the load (19) connected, and $V_{bat-ter,i}$ represents the updated difference between the latest measured voltage value at the terminal (16) prior to the connection of the load (19) and the first measured voltage value at the terminal (16) after the connection of the load (19).

4. An arrangement according to any of the preceding claims, characterized in that the control arrangement (18) is arranged to store a value of the terminal voltage $V_{bat,high}$ below which the terminal voltage is allowed to fall during a predetermined time interval, said control arrangement (18) being arranged to continuously carry out comparisons between the actual updated value of the terminal voltage and $V_{bat,high}$ and to disconnect the load (19) after a predetermine time interval if the actual terminal voltage is below $V_{bat,high}$.

5. An arrangement according to claim 1, characterized in that the control arrangement (18) is arranged to store a value of the terminal voltage $V_{bat,low}$ below which the terminal voltage is not allowed to fall, the control arrangement being arranged to continuously carry out comparisons between the actual updated value of the terminal voltage an $V_{bat,low}$ and to disconnect the load (19) if the actual value of the terminal voltage is below $V_{bat,low}$.

6. An arrangement according to claim 1, characterized in that the control arrangement (18) is arranged to store a voltage difference value $\Delta V_{bat,hys}$, said arrangement further being arranged so as when the load (19) has been disconnected due to the actual terminal voltage being below $V_{bat,high}$ or below $V_{bat,low}$ to allow reconnection of the load (19) only when the actual terminal voltage exceeds the sum of the value $V_{bat,high}$ and the value $\Delta V_{bat,hys}$.

7. Method for controlling the power supply to a load (19) fed from a rechargeable current source (15) of limited capacity, supplied with energy from a generator (17) and connected to the load (19) via a line (12) of resistance which connects to the load (19) via a terminal (16) at which voltage measurements can be performed, comprising the steps of:

arranging said control arrangement to allow for a current supply from the rechargeable current source if the voltage has a value greater than or equal to an upper reference value Vbat,high, continuing the current supply from the rechargeable current source during a predetermined time if the voltage is below the reference value Vbat,high but exceeds a second reference value Vbat,low, and disrupting the current supply if the voltage is below the reference value Vbat,low, performing voltage measurements at said terminal (16), wherein in a series of such voltage measurements at least one measurement is performed with the load (19) disconnected, whereas at least one measurement is performed with the load (19) connected, the initial measured voltage value representing the initial terminal voltage of the current source (15) at the start of the series of measurements, calculating said terminal voltage from the latest measured voltage value at the terminal(16) prior to the connection of the load (19) and the first measured voltage value at the terminal (16) after the connection of the load (19), and updating the latest measured voltage value at the terminal (16) prior to the connection of the load (19) in turn for each new measured voltage value at the terminal (16).

8. Method according to claim 7, characterized in that the difference between the latest measured voltage value at the terminal (16) prior to the connection of the load (19) and the first measured voltage value at the terminal (16) after connection of the load (19) is updated according to the following relation:

$\Delta V_{bat-ter,i} = \Delta V_{bat-ter,0} \times V_{ter,i}/V_{ter,0}$, where $V_{ter,0}$ is a first measured voltage value at the terminal (16) with connected load (19);

$V_{ter,0}$ is a first measured voltage value at the terminal (16) with connected load (19);

$\Delta V_{bat-ter,0}$ is the difference between the latest measured voltage value $V_{bat,lst}$ at the terminal (16) with the load (19) disconnected and $V_{ter,0}$.

9. Method according to claim 8, characterized in that the terminal voltage of the current source (15) is calculated according to the relation:

$V_{bat,i} = V_{ter,i} + \Delta V_{bat-ter,i}$, where $V_{ter,i}$ represents any voltage value measured at the terminal (16) with the load (19) connected, and $\Delta V_{bat-ter,i}$ represents the updated difference between the latest measured voltage value at the terminal (16) prior to the connection of the load (19) and the first measured voltage value at the terminal (16) after connection of the load (19).

10. Method according to any of the claims 7–9, characterized in that a value of the terminal voltage $V_{bat,high}$ is stored below which the terminal voltage is allowed to fall during a predetermined time interval, comparisons being continuously carried out between the actual updated value of the terminal voltage and $V_{bat,high}$, wherein the load (19) is disconnected after a predetermine time interval if the actual terminal voltage is below $V_{bat,high}$.

11. Method according to claim 7, characterized in that a value of the terminal voltage $V_{bat,low}$ is stored below which the terminal voltage is not allowed to fall and that comparisons are continuously carried out between the actual updated value of the terminal voltage and $V_{bat,low}$, the load (19) being disconnected if the actual value of the terminal voltage is below $V_{bat,low}$.

12. Method according to claim 7, characterized in that a voltage difference value $\Delta V_{bat,hys}$ is stored and when the load (19) has been disconnected due to the actual terminal voltage being below $V_{bat,high}$ or below $V_{bat,low}$ reconnection of the load (19) is allowed only when the actual terminal voltage exceeds the sum of the value $V_{bat,high}$ and the value $\Delta V_{bat,hys}$.

* * * * *